(12) United States Patent
Li et al.

(10) Patent No.: US 7,795,108 B2
(45) Date of Patent: Sep. 14, 2010

(54) RESISTANCE-BASED ETCH DEPTH DETERMINATION FOR SGT TECHNOLOGY

(75) Inventors: Tiesheng Li, San Jose, CA (US); Yu Wang, Fremont, CA (US); Yingying Lou, Shanghai, CA (US); Anup Bhalla, Santa Clara, CA (US)

(73) Assignee: Alpha & Omega Semiconductor, Ltd, Hamilton (BM)

( * ) Notice: Subject to any disclaimer, the term of this patent is extended or adjusted under 35 U.S.C. 154(b) by 27 days.

(21) Appl. No.: 12/399,632

(22) Filed: Mar. 6, 2009

(65) Prior Publication Data
US 2009/0166621 A1   Jul. 2, 2009

Related U.S. Application Data

(62) Division of application No. 11/690,581, filed on Mar. 23, 2007, now Pat. No. 7,521,332.

(51) Int. Cl.
*H01L 21/76* (2006.01)
(52) U.S. Cl. ...................................... 438/426
(58) Field of Classification Search ........................ None
See application file for complete search history.

(56) References Cited

U.S. PATENT DOCUMENTS

| | | | | |
|---|---|---|---|---|
| 5,126,807 A | 6/1992 | Baba et al. | ......... | 257/401 |
| 5,242,845 A | 9/1993 | Baba et al. | ......... | 438/243 |
| 5,260,227 A | 11/1993 | Farb et al. | ......... | 438/192 |
| 5,283,201 A | 2/1994 | Tsang et al. | ......... | 438/138 |
| 5,578,508 A | 11/1996 | Baba et al. | ......... | 438/270 |
| 5,648,283 A | 7/1997 | Tsang et al. | ......... | 438/138 |
| 5,801,417 A | 9/1998 | Tsang et al. | ......... | 257/333 |
| 5,998,833 A | 12/1999 | Baliga | ......... | 257/329 |
| 6,388,286 B1 | 5/2002 | Baliga | ......... | 257/330 |
| 6,545,316 B1 | 4/2003 | Baliga | ......... | 257/329 |

(Continued)

FOREIGN PATENT DOCUMENTS

JP     63-296282 A     12/1988

OTHER PUBLICATIONS

Office Action dated Apr. 28, 2008 for U.S. Appl. No. 11/690,581, 11 pages.

*Primary Examiner*—Charles D Garber
*Assistant Examiner*—Andre' C Stevenson
(74) *Attorney, Agent, or Firm*—Joshua D. Isenberg; JDI Patent

(57) ABSTRACT

A method for determining the depth etch, a method of forming a shielded gate trench (SGT) structure and a semiconductor device wafer are disclosed. A material layer is formed over part of a substrate having a trench. The material fills the trench. A resist mask is placed over a test portion of the material layer thereby defining a test structure that lies underneath the resist mask. The resist mask does not cover the trench. The material is isotropically etched and a signal related to a resistance change of the test structure is measured. A lateral undercut $D_L$ of the test structure is determined from the signal and an etch depth $D_T$ is determined from $D_L$. The wafer may comprise one or more test structures forming a bridge circuit; one or more metal contacts that electrically connect the test structures through contact holes: and resist layer including over the test structures.

5 Claims, 5 Drawing Sheets

U.S. PATENT DOCUMENTS

| | | | |
|---|---|---|---|
| 6,573,559 B2 | 6/2003 | Kitada et al. | 257/330 |
| 6,621,121 B2 | 9/2003 | Baliga | 257/330 |
| 6,677,641 B2 | 1/2004 | Kocon | 257/329 |
| 6,683,346 B2 | 1/2004 | Zeng | 257/330 |
| 6,690,062 B2 | 2/2004 | Henninger et al. | 257/340 |
| 6,706,615 B2 | 3/2004 | Kitada et al. | 438/430 |
| 6,764,889 B2 | 7/2004 | Baliga | 438/197 |
| 6,870,220 B2 | 3/2005 | Kocon et al. | 257/340 |
| 6,891,223 B2 | 5/2005 | Krumrey et al. | 257/330 |
| 7,098,500 B2 | 8/2006 | Zeng | 257/302 |
| 7,372,072 B2 * | 5/2008 | Winter et al. | 257/48 |
| 2003/0045068 A1 | 3/2003 | Gutsche et al. | 438/386 |
| 2004/0256665 A1 | 12/2004 | Birner et al. | 257/329 |
| 2005/0118775 A1 | 6/2005 | Goldbach et al. | 438/386 |
| 2005/0161749 A1 | 7/2005 | Yang et al. | 257/414 |
| 2006/0157700 A1 * | 7/2006 | Winter et al. | 257/48 |
| 2007/0032089 A1 | 2/2007 | Nuzzo et al. | 438/725 |
| 2008/0057671 A1 | 3/2008 | Furukawa et al. | 438/426 |
| 2008/0233748 A1 | 9/2008 | Lou et al. | 438/689 |
| 2008/0272371 A1 | 11/2008 | Li et al. | 257/48 |

* cited by examiner

US 7,795,108 B2

RESISTANCE-BASED ETCH DEPTH DETERMINATION FOR SGT TECHNOLOGY

CLAIM OF PRIORITY

This application is a divisional of and claims the priority benefit of commonly-assigned U.S. patent application Ser. No. 11/690,581 entitled "RESISTANCE-BASED ETCH DEPTH DETERMINATION FOR SGT TECHNOLOGY" to Tiesheng Li, Yu Wang, Yingying Lou and Anup Bhalla, filed Mar. 23, 2007, now U.S. Pat. No. 7,521,332 the entire disclosures of which are incorporated herein by reference.

CROSS-REFERENCE TO RELATED APPLICATIONS

This application is related to co-pending application Ser. No. 11/690,546, to Yingying Lou et al., entitled "ETCH DEPTH DETERMINATION FOR SGT TECHNOLOGY", filed on Mar. 23, 2007, the entire disclosures of which are incorporated herein by reference.

FIELD OF THE INVENTION

This invention generally relates to semiconductor power device and more particularly to a fabrication process for controlling the depth of a floating gate of the MOSFET transistors.

BACKGROUND OF THE INVENTION

MOSFET (metal-oxide-semiconductor field effect transistor) devices have many electrical applications including use in RF/microwave amplifiers. In such applications, the gate to drain feedback capacitance must be minimized in order to maximize RF gain and minimize signal distortion. In a silicon power MOSFET, the gate electrode provides turn-on and turn-off control upon the application of an appropriate gate bias.

Conventional technologies for reducing the gate to drain capacitance $C_{gd}$ in a DMOS device are still confronted with technical limitations and difficulties. Specially, trenched DMOS devices are configured with trenched gates wherein large capacitance ($C_{gd}$) between gate and drain limits the device switching speed. The capacitance is mainly generated from the electrical field coupling between the bottom of the trenched gate and the drain. In order to reduce the gate to drain capacitance, an improved Shielded Gate Trench (SGT) structure is introduces at the bottom of the trenched gate to shield the trenched gate from the drain.

U.S. Pat. Nos. 5,126,807 and 5,998,833 illustrate examples of shielded gate trench (SGT) MOSFET as a promising solution in high speed switching applications with the SGT function as a floating gate in the lower part of the trench or fix to a source voltage. However, a challenge of the processes disclosed in the above-mentioned references is to control the depth of the floating gate in order to avoid the malfunction of the MOSFET. Control of etch depth is particularly important, e.g. when etching back polysilicon to the middle of the gate trench because this is not an end point etch. As the feature sizes continue to shrink floating gate etch back control becomes a more challenging and important task.

A common prior art technique for controlling etch depth, referred to herein as time control, involves control of the etch duration. In this technique an etch rate is determined and the etch depth may be calculated by timing the etch process and multiplying the etch rate by the etch duration. Unfortunately, the etching rate for polysilicon highly depends on numerous factors including, e.g., polysilicon grain size, doping, trench size and overall loading effect. Thus, the etch rate for polysilicon can be difficult to determine and the actual etch back depth is uncertain. This makes it difficult to improve the device manufacturing as no data related to the etch back depth except the etch back time is available to correlate the device performance with the etch back depth.

It is within this context that embodiments of the present invention arise.

BRIEF DESCRIPTION OF THE DRAWINGS

Objects and advantages of the invention will become apparent upon reading the following detailed description and upon reference to the accompanying drawings in which.

DESCRIPTION OF THE SPECIFIC EMBODIMENTS

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Figure 1A:
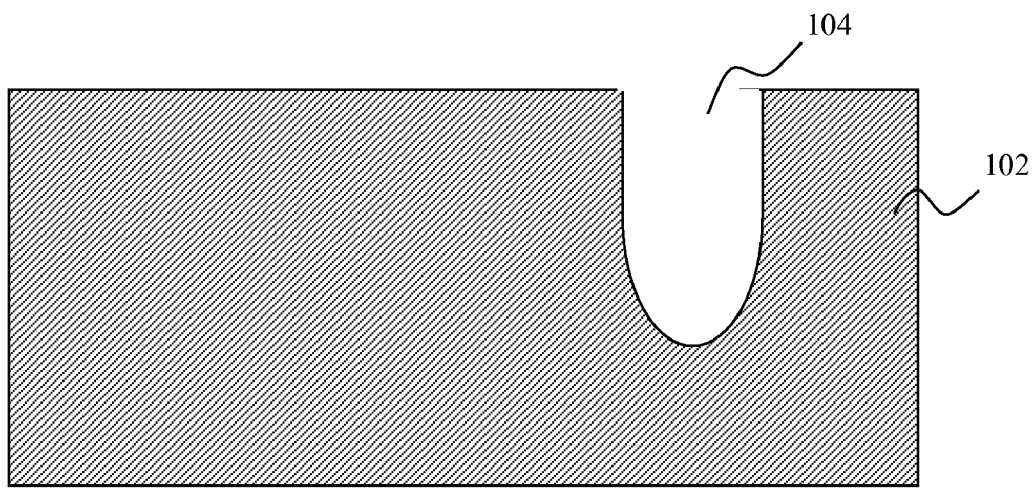
FIGS. 1A-1E is cross sectional views for showing the processing steps the SGT floating gate at the lower portion of the trench according to an embodiment of the present invention.
Figure 1B:
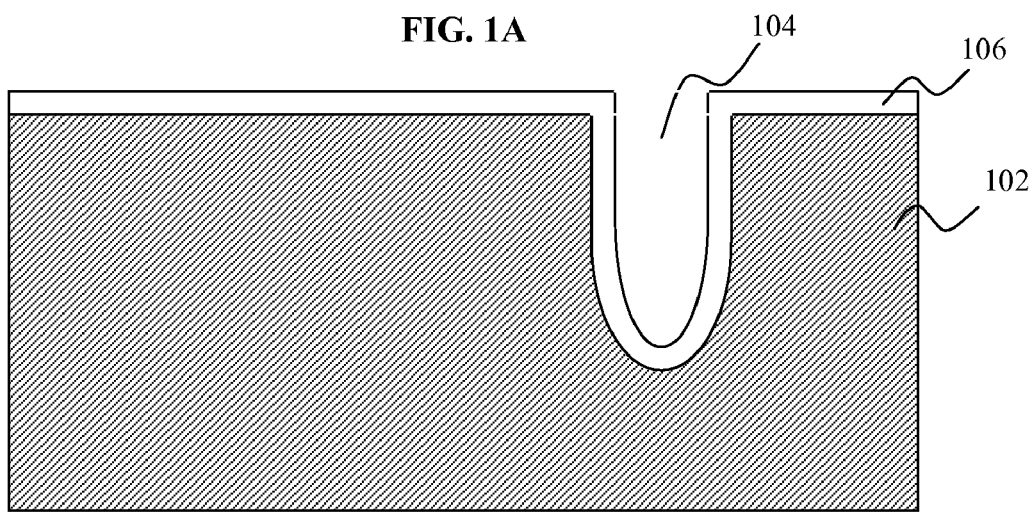

FIGS. 1A-1E are cross sectional view illustrating a method of making the SGT structure according to an embodiment of the present invention. As shown in FIG. 1A, a trench 104 of 0.3-0.6 micron wide and 1-3 micron deep is etched into a semiconductor layer 102, such as a layer of silicon, by an anisotropic etching technique such as Reactive Ion Etching (RIE). An electrical insulating layer 106, such as silicon oxide film, is formed over the material including the inside of the trench 104 using a thermal oxidation technique as shown in FIG. 1B.

Figure 1C:
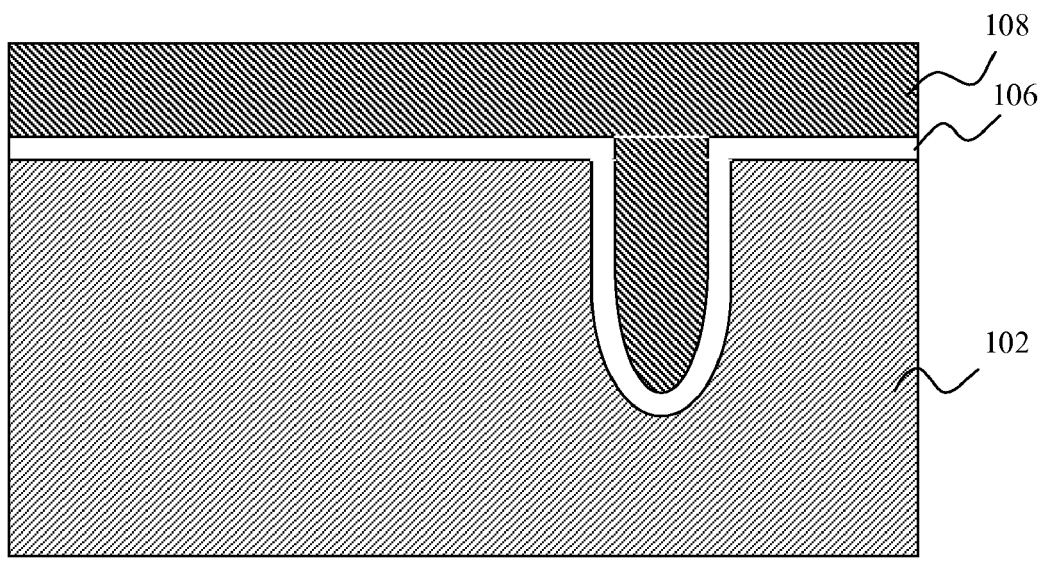
Figure 1D:
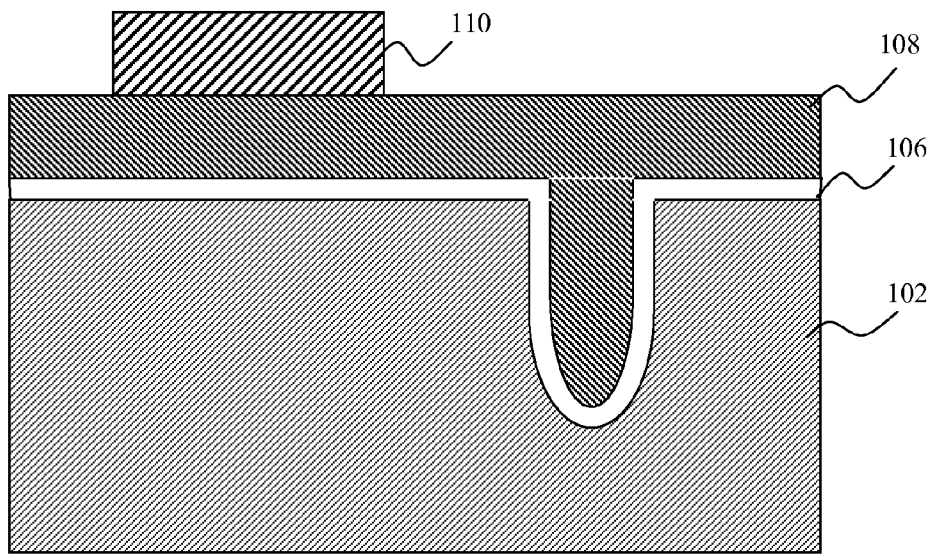

In FIG. 1C, the trench 104 is filled with polysilicon with a low-pressure chemical vapor deposition (LPCVD) technique, thus a polysilicon film 108 is formed over the trench and the Si layer surface. A photoresist mask or a dielectric hard mask 110 having a bar-shaped test structures with a length L and a width W is placed over the polysilicon film 108, but not over the trench 104, as shown in FIG. 1D.

Figure 1E:
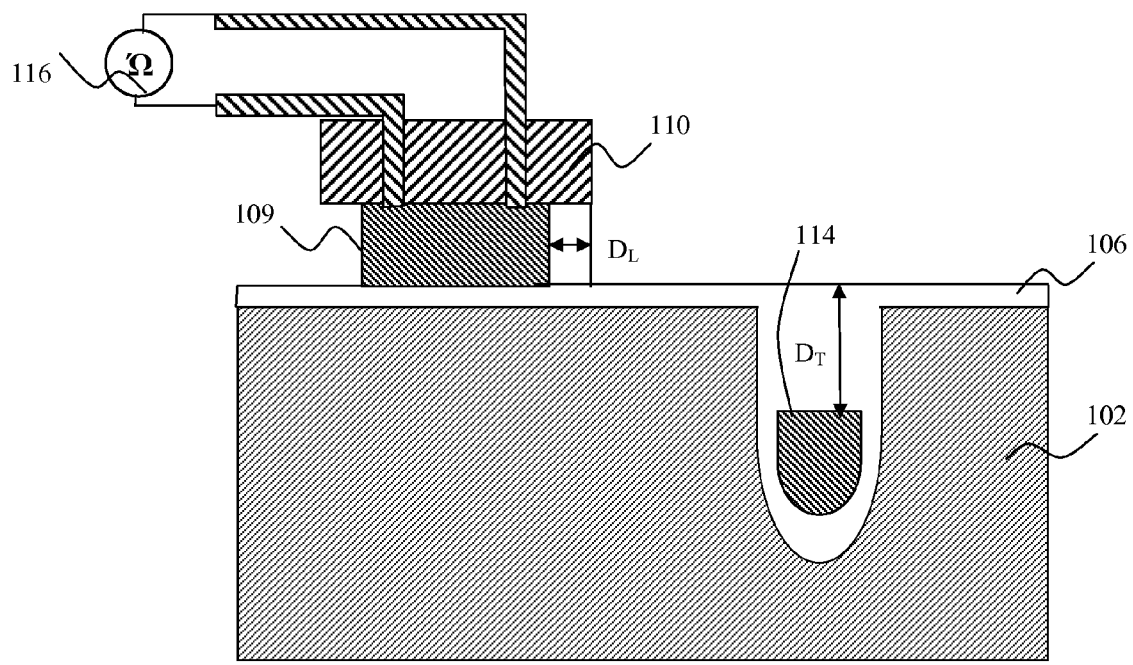

The polysilicon film 108 is isotropically etched back in order to remove the polysilicon on the sidewall to a desired depth $D_T$ inside the trench 104 to form a shielding gate electrode 114 as shown in FIG. 1E. The desired depth $D_T$ may be controlled by monitoring the lateral undercut $D_L$ of the polysilicon test structures 109 under the mask 110 and determining an etch depth $D_T$ of the material in the trench 104 based on the amount of lateral undercut $D_L$. The trench depth $D_T$ may be determined as long as $D_L$ data is available and a relationship between $D_T$ and $D_L$ is established. The relationship between the lateral undercut $D_L$ and the trench depth $D_T$ may be expressed as:

$$D_T = F(D_L) \qquad (1)$$

The function $F(D_L)$ relating $D_T$ and $D_L$ may be determined experimentally. For example, a test may be performed with trenches of different known depths filled with the material 108. Lateral undercut $D_L$ may be measured when the etch depth $D_T$ reaches the bottom of each trench. The function $F(D_L)$ may be determined from the measured values of $D_L$ and the known depths of the trenches.

One way to determine $D_L$ is to measure the resistance of the polysilicon test structure under the mask and then to convert into the change in width AW of the portion of polysilicon ($D_L = \Delta W$).

Theoretically:

$$R = R_{sheet} \frac{L}{W} \qquad (2)$$

Where:
R is the resistance of the portion of polysilicon,
$R_{sheet}$ is the sheet resistance of the portion of polysilicon.
L is the length and W is the width of the portion of polysilicon.

Figure 1F:
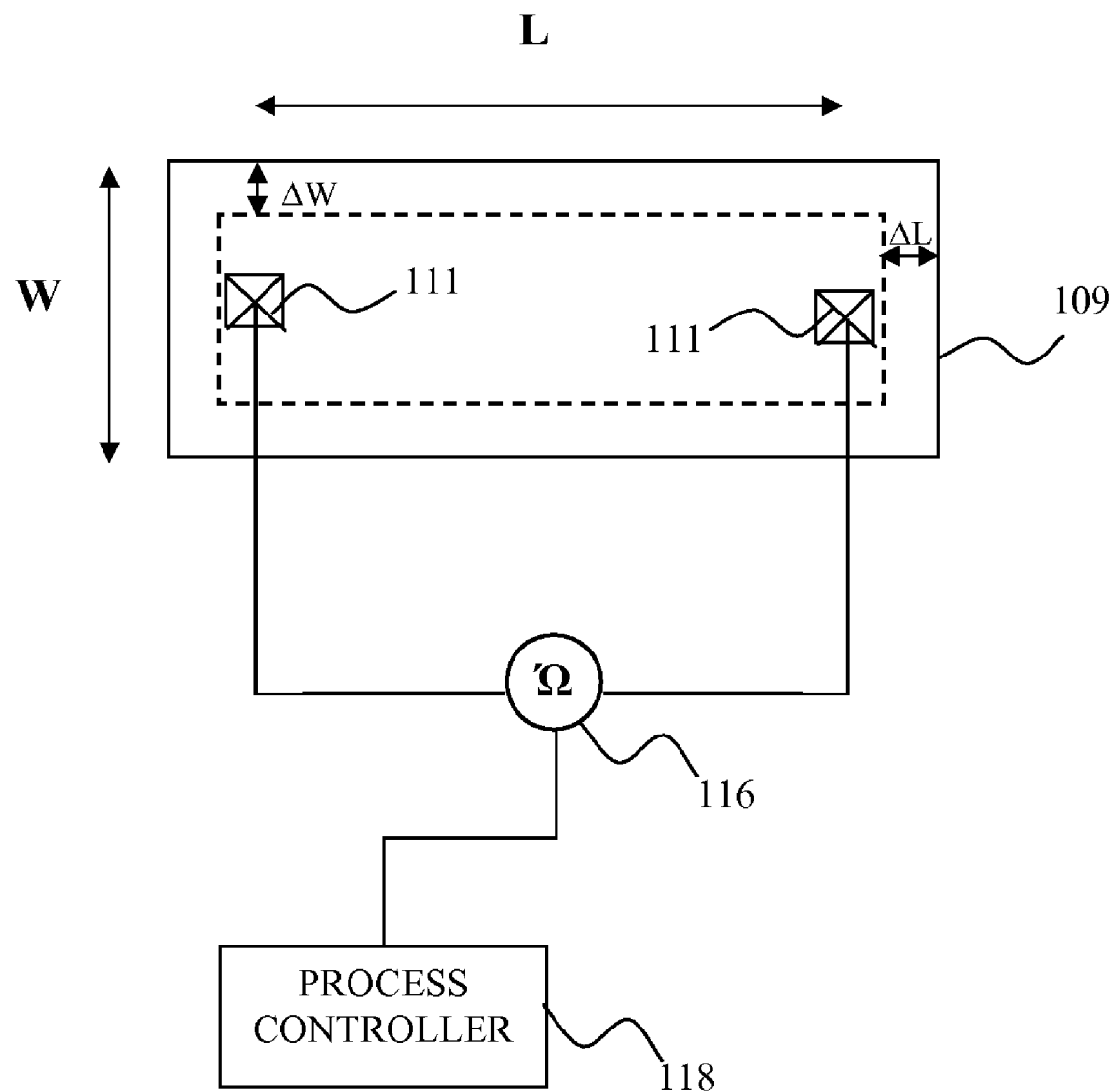
FIG. 1F is top view schematic diagram illustrating an electrical connection for measuring the resistance of the portion of the polysilicon under the photoresist mask.

For a thin film of uniform thickness t, the sheet resistance is conventionally defined as $R_{sheet} = \rho/t$, where $\rho$ is the resistivity of the material making up the film. As the thickness of the thin film under mask 10 remains the same during etch back process, the R measurement may only depend on the length L and the width W. If the contact points 111 for measuring the resistance are away from both the ends of the bar-shaped polysilicon so that the sample length L for R measurement does not change during etching process, then the R measurement only depends on width W, which is related to the undercut ($\Delta W$). It is noted that a signal related to the change in resistance of the test structure 109 resulting from the lateral etching may be measured. This signal may be used to control and calibrate the etch process. In particular, the signal may be used to determine the etch depth $D_T$. For example, as shown in FIG. 1E, the test structure 109 may be connected to an Ohm meter 116 for measuring its resistance. By way of example, FIG. 1F shows a top view schematic diagram showing an electrical connection of the portion of the test structure 109, before etching (solid lines) and after etching (dashed lines), with the Ohm meter 116 coupled to a process controller 118. The process controller 118 may include a processor, e.g., a general purpose computer or special purpose circuitry such as an application specific integrated circuit (ASIC). A signal from the Ohm meter 116 may be used by the controller 118 to track the etch depth $D_T$. This signal can provide the process controller 118 with information that may be used to adjust the etching process, e.g., by slowing it down, speeding it up or stopping completely. For example, in the case of etching by gas or plasma, the controller 118 may control flow rates of reactive gases. In the case of wet etch, the controller 118 may control concentration of reactive liquids or may control a robot arm or similar device that lifts a substrate containing the test structure 109 out of an etch bath when the signal indicates a desired etch depth $D_T$ has been reached.

Figure 2A:
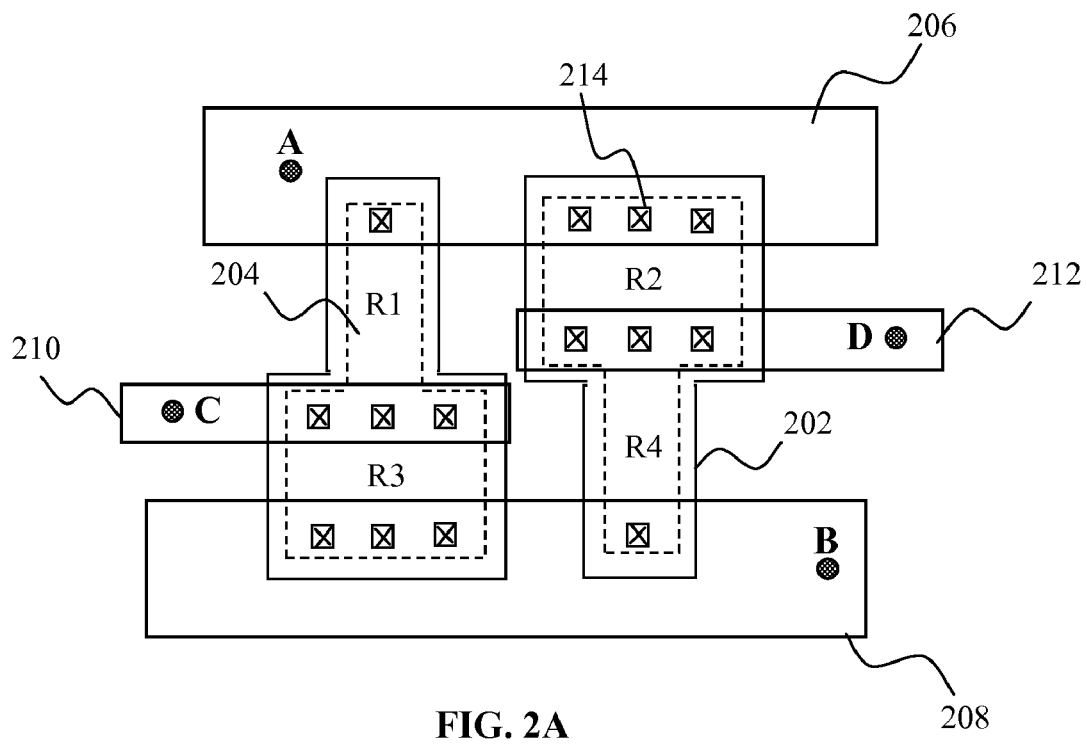
FIG. 2A is a top view schematic diagram illustrating a lay out design implementing the Wheatstone bridge for measuring the electrical resistance of the polysilicon test structures.
Figure 2B:
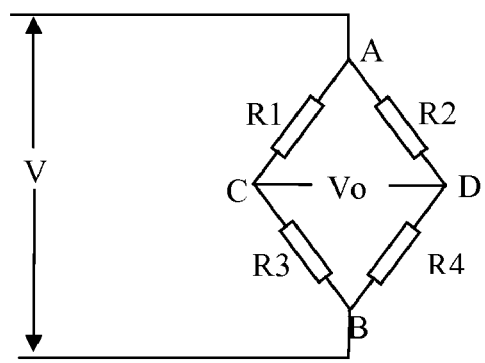
FIG. 2B is a Wheatstone bridge circuit diagram corresponding to the lay out design of FIG. 2A.

In some embodiments, the test structure may be one of a plurality of test structures that make up a bridge circuit, such as a Wheatstone bridge or Mueller bridge. For example FIG. 2A depicts a top view of polysilicon test structures connected in a Wheatstone bridge circuit pattern. As shown in FIG. 2A, the solid line indicates mask 202 that overlies one or more test structures 204, which are shown after a certain amount of etch-back, as indicated by the dashed lines. The test structures may be electrically connected by overlying metal interconnects 206, 208, 210 and 212 through contact holes 214. FIG. 2B is an electrical schematic diagram of a Wheatstone bridge circuit corresponding to the lay out in FIG. 2A. To reduce the measurement error caused by process mismatch and variation, R1 and R4 may be two identical sensing resistors and R2 and R3 may be two identical dummy resistors. A voltage V between points A and B causes current to flow through the circuit from point A to point B. An output voltage $V_O$ may be measured between points C and D.

may be given by:

$$V_O = V \times \frac{R3 - R4}{R_{tot}} \qquad (3)$$

Where $R_{tot} = R1 + R3 = R2 + R4$

Due to the process variation and the undercut during the polysilicon etch, the resistance R of each polysilicon resistor deviates by an amount JR from its nominal value R. The relative change in resistance of a given resistor may be given by:

$$\frac{\Delta R}{R} = \frac{\Delta R_{sheet}}{R_{sheet}} + \frac{\Delta L}{L} - \frac{\Delta W}{W} \qquad (4)$$

Assuming the resistors are all made from a common layer of material of thickness t, the resistivity of the material may be expected to be the same. As explained earlier, the thickness of polysilicon test structures 204 under the mask 202 does not change and the measurement length L is not affected by the etching process, the relative change in resistance may be approximated by:

$$\frac{\Delta R}{R} = -\frac{\Delta W}{W} \qquad (5)$$

By substituting (4) into (2), and assuming $R1 = R + \Delta R1$, $R2 = R + \Delta R2$, $R3 = R + \Delta R3$, $R4 = R + \Delta R4$, the output voltage $V_O$ may approximated by:

$$V_O = V \times \frac{\frac{\Delta W4}{W4} - \frac{\Delta W3}{W3}}{2 - \frac{\Delta W1}{W1} - \frac{\Delta W3}{W3}} \qquad (6)$$

In a preferred embodiment, the resistors making up the Wheatstone bridge arms may be designed as follows. R1 and R4 may be narrow sensing resistors used to sense the undercut, while R2 and R3 may be much wider dummy resistances. R1 may be congruent to R4 and R2 may be congruent to R3. Under this circumstances, $\Delta W3/W3 << \Delta W4/W4 = \Delta W1/W1$. Therefore $$Vo = V \times \frac{\frac{\Delta W4}{W4}}{2 - \frac{\Delta W4}{W4}} \quad (7)$$

Polysilicon test structures of the type described above in FIGS. 2A-2B may be employed in semiconductor wafers at an intermediate step of a semiconductor manufacturing process. In some other embodiments, the test structure may be constructed in a testing area as a test structure to verify critical dimensions (CD) of device manufacture process. Mask 202 may be stripped off at a later stage or remained in case a hard mask is used. The following manufacturing steps may apply more layers of dielectric material over the test structures 204. The metal interconnects 206, 208, 210 and 212 and contact holes 214 may be formed at the same time the device contacts are opened and contact metals are deposited and patterned.

Figure 3:
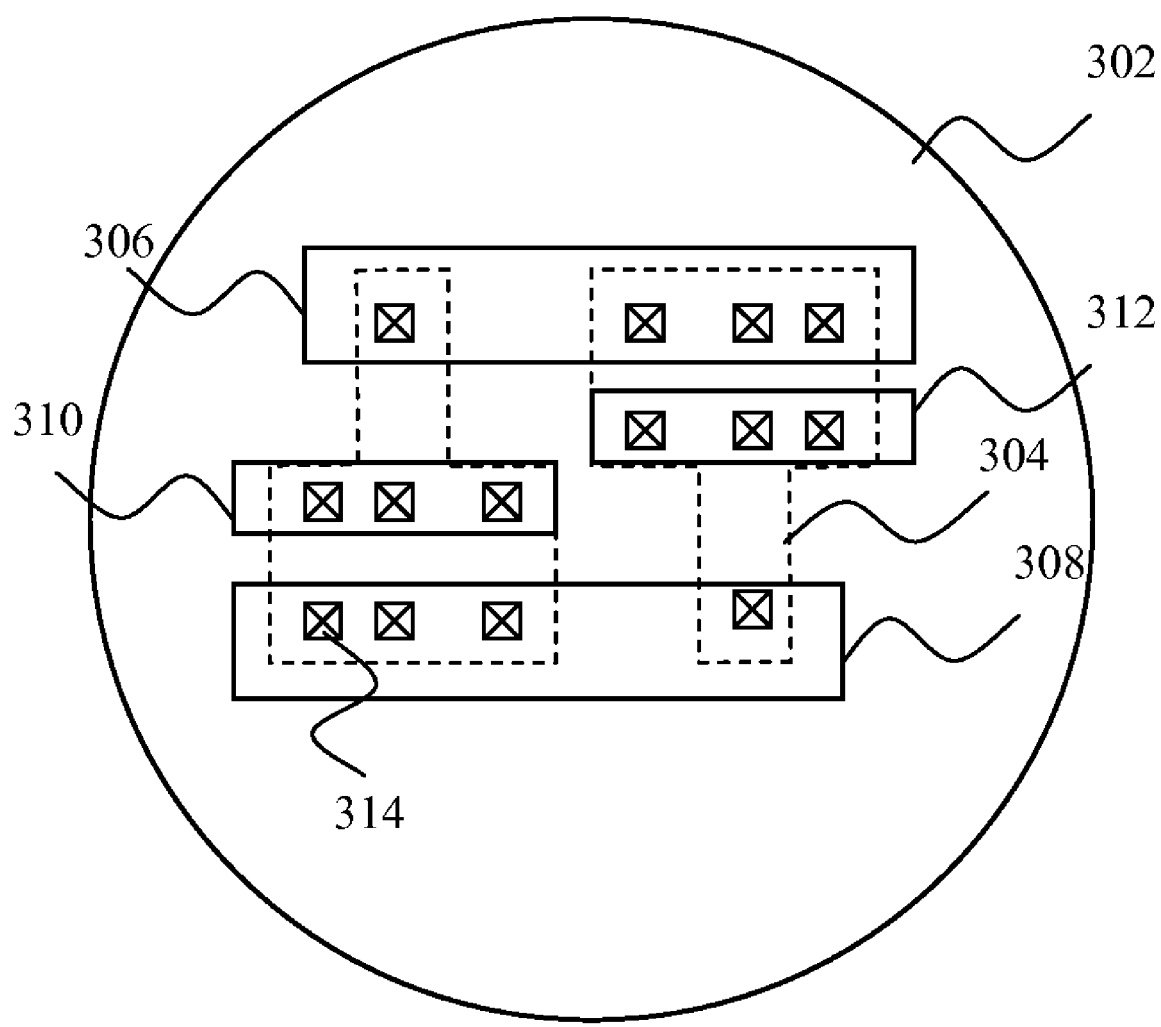
FIG. 3 is a top view of a semiconductor wafer with the polysilicon test structures forming a Wheatstone bridge circuit at an intermediate step of the manufacturing process according to an embodiment of the present invention.

By way of example, FIG. 3 is a top view illustrating a wafer 302 having polysilicon test structures 304 forming a Wheatstone bridge circuit. The polysilicon test structures 304 may be electrically connected with metal A 306, metal B 308, metal C 310 and metal D 312 through contact holes 314.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A", or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A wafer of semiconductor field effect transistors comprising:
   one or more polysilicon test structures forming a Wheatstone bridge circuit;
   a layer of dielectric material including one or more portions that cover one or more corresponding portions of the test structures; and
   one or more metal contacts configured to electrically connect the test structures through contact holes opened through the dielectric material covering the test structures,
   wherein the polysilicon test structures form four polysilicon resistors at four arms of the Wheatstone bridge circuit.

2. The wafer of claim 1 wherein one or more of the test structures comprises a bar shape.

3. The wafer of claim 1, wherein the polysilicon resistors at two opposite arms of the Wheatstone bridge are identical.

4. The wafer of claim 1, wherein the four polysilicon resistors comprise two identical polysilicon resistors that are bigger than two other identical polysilicon resistors.

5. The wafer of claim 3 wherein a length to width ratio L/W of two identical polysilicon resistors is larger than a length to width ratio L/W of other two identical polysilicon resistors.

* * * * *